(12) United States Patent
Sinclair

(10) Patent No.: US 7,135,764 B2
(45) Date of Patent: Nov. 14, 2006

(54) SHIELDED SEMICONDUCTOR CHIP CARRIER HAVING A HIGH-DENSITY EXTERNAL INTERFACE

(75) Inventor: William Y. Sinclair, Frenchtown, NJ (US)

(73) Assignee: Aries Electronics, Inc., Frenchtown, NJ (US)

( * ) Notice: Subject to any disclaimer, the term of this patent is extended or adjusted under 35 U.S.C. 154(b) by 282 days.

(21) Appl. No.: 10/909,767

(22) Filed: Aug. 2, 2004

(65) Prior Publication Data

US 2005/0030705 A1 Feb. 10, 2005

Related U.S. Application Data

(60) Provisional application No. 60/493,617, filed on Aug. 7, 2003.

(51) Int. Cl.
*H01L 23/552* (2006.01)
(52) U.S. Cl. ..................... 257/692; 257/659
(58) Field of Classification Search ............... 257/659, 257/660, 692
See application file for complete search history.

(56) References Cited

U.S. PATENT DOCUMENTS

| | | | | |
|---|---|---|---|---|
| 5,548,486 A | * | 8/1996 | Kman et al. | 361/791 |
| 5,575,688 A | * | 11/1996 | Crane, Jr. | 439/660 |
| 5,659,953 A | * | 8/1997 | Crane et al. | 29/843 |
| 5,696,027 A | * | 12/1997 | Crane et al. | 438/612 |
| 6,577,003 B1 | | 6/2003 | Crane, Jr. et al. | |

\* cited by examiner

*Primary Examiner*—Roy Potter
(74) *Attorney, Agent, or Firm*—Anthony J. Casella; Gerald E. Hespos

(57) ABSTRACT

A shielded semiconductor chip carrier having a high-density external interface includes conventional printed circuit boards having plated through holes for achieving shielding of the contacts of the matrix. Two fork type connectors have molded about the distal ends thereof an annular ring of dielectric plastic material, and fork type connectors are press fit into each plated through hole, thereby locking the electrical contact within the shield formed by the plated through hole. The resulting connector provides a high-density contact matrix with each connector being electrically shielded along substantially its entire length.

10 Claims, 5 Drawing Sheets

SHIELDED SEMICONDUCTOR CHIP CARRIER HAVING A HIGH-DENSITY EXTERNAL INTERFACE

This application claims priority from U.S. Provisional Application No. 60/493,617, filed Aug. 7, 2003, which is incorporated herein by reference.

BACKGROUND OF THE INVENTION

1. Field of the Invention

The present invention relates to a semiconductor chip or die carrier having a reduced size and, more particularly, a semiconductor die carrier affording an external interface having a high-density of electrically conductive contacts concentrated within a very small area and designed to shield the interconnection between the electrical contacts.

2. Description of the Related Art

Semiconductor packages typically contain a semiconductor die having bonding pads formed thereon, a plurality of leads connected to the bonding pads of the semiconductor die, and insulative packaging material formed around the semiconductor die and inner portions of the leads. Such a semiconductor package allows the transmission of electrical signals between the semiconductor die and an interface surface, such as a printed circuit board (PCB), via the bonding pads of the semiconductor die, and electrically conductive pads between the bonding pads and the leads, the leads themselves, and traces on the interface surface.

In the prior art, various methods are known for providing the electrically conductive path between the semiconductor die and the leads of the semiconductor package. Such methods, commonly referred to as bonding techniques, include C4 (controlled collapse die connection) bonding, wire bonding, and TAB (Tape Automated Bonding).

Conventional semiconductor packages suffer from many deficiencies. Conventional PGA (Pin Grid Array) packages, for example, tend to take up large amounts of circuit board area. Indeed, PGA packages generally increase significantly in size as more input/output interconnections are needed, suggesting that future PGA packages for microprocessors will take up even more board area than existing PGA packages.

The manner in which conventional C4 and other bonding technologies are currently being used contributes to the aforementioned area usage problem. For example, in C4 technology, the interconnections provide useful electrical connections, but do not provide an adequate amount of mechanical strength for the types of leads now in use. Moreover, C4 connections are not typically applicable for use within pluggable semiconductor packages. Consequently, in the assembly of PGAs, manufacturers who use conventional C4 bonding technology require that the portions of the leads extending externally from the PGA must be spaced apart to a significant extent. Of course, such spacing increases the area of the PCB that will be occupied by the PGA. Moreover, the use of a multi-layer conductor for supporting the semiconductor die within the PGA package also adds to the size and cost of the PGA package. Furthermore, conventional C4 bonding technology can result in problems with individual lead parasites, inspectability and testing problems, and problems relating to touch-up and repair of the connections.

In addition to increasing the size of conventional PGA-type semiconductor packages, the use of leads that are intentionally spread apart to compensate for mechanical insufficiencies and to allow for pluggable and/or non-pluggable mounting, and the use of multi-layer conductors for supporting the semiconductor die within such packages, all contribute to deficiencies associated with conventional PGA-type semiconductor packages. These deficiencies include a lengthening in the amount of distance that electrical signals must travel within the semiconductor package, which lengthening affects signal propagation times; an increase in the amount of noise imparted to such electrical signals; an elevation in the power requirements for the semiconductor package; and an increase in the complexity of processes required to manufacture the semiconductor package.

Another problem associated with conventional PGA-type semiconductor packages is that such packages, when not used with a socket, are commonly mounted on PCBs using conventional plated-through hole technology. This necessitates the performance of a soldering step, and such mounting technique increases the complexity and expense of the manufacturing operation. Of course, the use of solder strictly limits upgradability of the assembly, thereby making it difficult to replace components.

The cost of the ceramic packaging material and brazed pin assembly is another disadvantage of PGA-type packages. In addition, such packages have low-performance heat sink characteristics, and such packages are costly to manufacture because they include an excessive number of manufacturing processes.

Another problem associated with conventional semiconductor chip carriers relates to electrical interference. As the speed of microprocessors and other electrical components increases, and as the airwaves are filled with all different types of spurious electrical signals coming in from different sources, the requirement for shielded connectors becomes acute. A shielded connector is similar to a coaxial connector wherein a central pin is surrounded by an insulated material, such as Teflon®, and the Teflon® is surrounded by a gold-plated cylindrical member which, in turn, is surrounded by plastic and with interconnecting means being provided for connecting the coaxial connector components. In a semiconductor chip carrier, it is desirable to have both high-density, as well as individual shielding of each contact.

From the foregoing, it can be understood that conventional semiconductor packages, such as PGA-type packages, take up large amounts of board space. In addition, they are frequently not removably pluggable, and are not easily tested in the field or during manufacture. It is common that such conventional semiconductor packages experience greater amounts of noise and have increased power requirements due to the long distances signals must travel within such packages. Usually, in conventional semiconductor packages, the space occupied by the entire package is many times greater than the space actually required for the semiconductor die.

U.S. Pat. No. 6,577,003 which issued to Crane, Jr. et al. on Jun. 10, 2003 discloses a semiconductor chip carrier affording a high-density external interface. The disclosure of U.S. Pat. No. 6,577,003 is incorporated herein by reference. Although high density is achieved in the chip carrier of U.S. Pat. No. 6,577,003, the electrical contacts of said chip carrier are not shielded.

As a result of the foregoing deficiencies incurred in semiconductor packaging technology, the latter is not sufficient to meet the needs of existing and/or future semiconductor and computer technology. Semiconductor packaging technology has already failed to keep pace with semiconductor die technology and, as computer and microprocessor speeds continue to climb, with greater interference surrounding such packages, and with space efficiency becoming increasingly important, semiconductor packages having even smaller area requirements will be required, and such semiconductor packages must be suitably shielded.

SUMMARY OF THE INVENTION

An object of the subject invention is to provide a semiconductor die carrier having a reduced size to allow a reduction in overall size of the system incorporating the die carrier.

A further object of the subject invention is to provide an SMT-compatible or pluggable semiconductor die carrier which does not use a multi-layer conductor for supporting the semiconductor die so that a very low profile package may be provided.

It is a further object of the subject invention to provide a semiconductor die carrier wherein the individual contacts are effectively shielded along their entire length, thereby obviating interference with extraneous and external electrical noise.

The above and other objects are achieved by the subject invention wherein resort is made to conventional printed circuit boards having plated-through holes for achieving shielding of the contacts of the matrix. The shielded matrix is achieved by taking printed circuit board material, such as FR4, which has the same expansion rate as the printed circuit board it is going on, and making it a shielded connector by: (1) leaving the copper on the board, drilling through the two layers of copper on the top and bottom of the board using standard printed circuit board technology to plate through; (2) using a fork type connector with a blade that fits into the fork so as to get a redundant contact; and (3) molding an annular ring of Teflon® or other type of plastic material surrounding the distal ends of the fork type connector and the blade so that the latter may be press fit into the plated-through holes, thereby locking the electrical contact within the shield formed by the plated-through holes. The resulting structure provides for a high-density contact matrix, with each of the conductors being electrically shielded along substantially their entire length.

DETAILED DESCRIPTION OF THE PREFERRED EMBODIMENTS

A prefabricated semiconductor die carrier in accordance with the present invention can support over 1,000 contacts (leads) per square inch in either pluggable or SMT-compatible configurations. Because it has a greater contact density, the semiconductor die carrier of the present invention allows for more grounding leads, permitting increased signal speed and more efficient noise reductions because of its shielded construction.

As a result of the construction of the subject invention, the semiconductor die carrier can be housed in significantly smaller, prefabricated packages than those currently available. The packages for the semiconductor die carrier of the present invention can be pluggable or SMT-compatible.

The shielded semiconductor chip carrier of the subject invention is basically similar to the semiconductor chip carrier of U.S. Pat. No. 6,577,003, except that the subject invention includes a totally different plugging aspect which provides increased connector density, as well as electrical shielding of the connectors.

Figure 1:
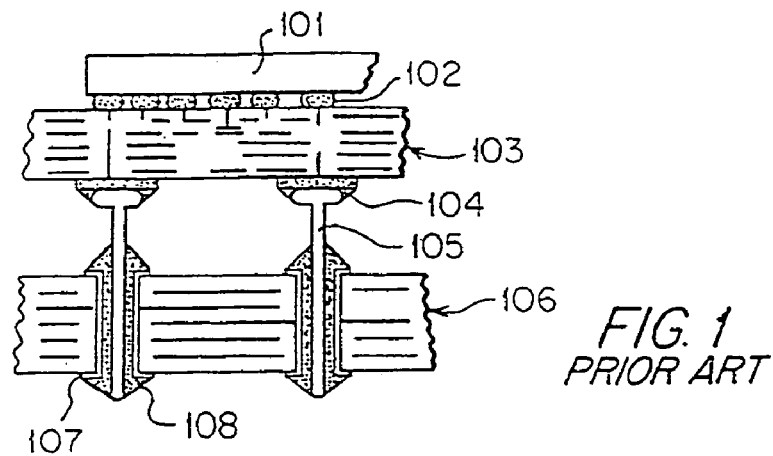
FIG. 1 is a side view of components of a semiconductor package manufactured in accordance with a conventional C4 bonding technique.

FIG. 1 is a side view of components of a prior art semiconductor package manufactured in accordance with a conventional C4 bonding technique. As shown in FIG. 1, in the C4 bonding, a semiconductor die 101 is selected, and an array of miniature solder balls 102, each for forming a C4 interconnection, is attached to the lowest surface of the semiconductor die. The semiconductor die 101 is place on a multi-layer conductor 103, and then the solder balls are melted to establish permanent C4 interconnections between the die 101 and the multi-layer conductor 103. Leads 105 are attached to the bottom surface of the multi-layer conductor 103 using brazed joint 104 so that electrical signals may be transmitted between the multi-layer conductor and a PCB 106. The latter includes plated-through holes (PTHs) 107 within which the leads 105 are mounted and secured, respectively, through use of a solder material 108.

Figure 2:
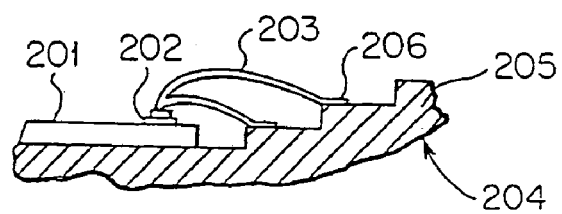
FIG. 2 is a side view of components of a semiconductor package of the prior art configured in accordance with a conventional wire bonding technique.

Turning to FIG. 2, there is illustrated a side view of components of a semiconductor package configured in accordance with the prior art using a conventional wire bonding technique. In wire bonding, a semiconductor die 201 having a plurality of bonding pads 202 formed thereon, and one end of a bonding wire 203 is connected to a corresponding bonding pad. The other end of the bonding wire 203 is connected to a package component 204 including insulative material 205 and conductive pads 206 formed thereon. Leads which are not shown extend from the bottom surface of the package component 204 so that electrical signals may be transmitted between the package component and a PCB (not shown).

As noted above, conventional semiconductor packages take up large amounts of board space, are not easily tested in the field or during manufacture, and commonly experience greater amounts of noise.

Figure 3:
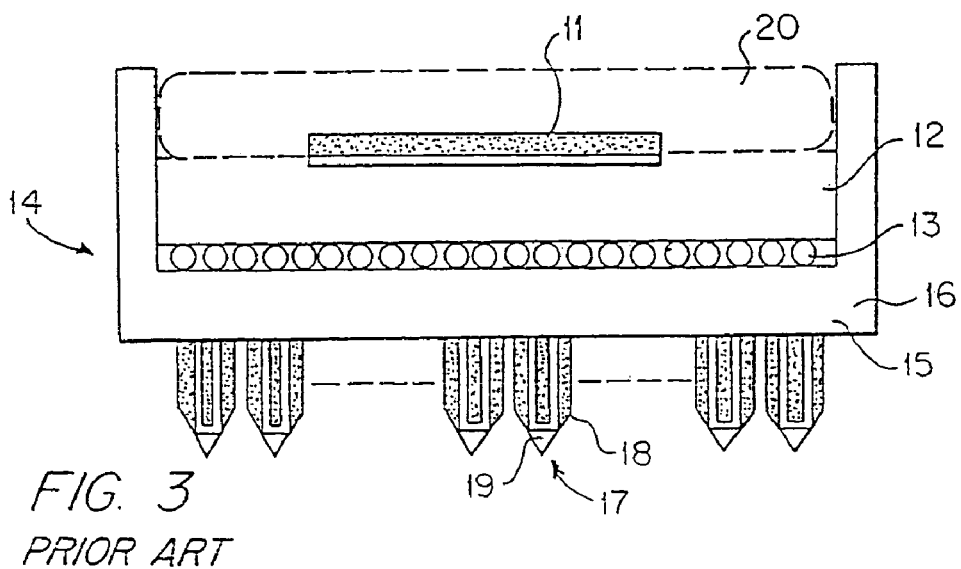
FIG. 3 is a side view of an embodiment of a semiconductor die carrier in accordance with the teachings of U.S. Pat. No. 6,577,003 which issued on Jun. 10, 2003 to Crane, Jr. et al.

FIG. 3 illustrates a semiconductor die carrier of the prior art as taught in U.S. Pat. No. 6,577,003. The prior art semiconductor die carrier includes a semiconductor die 11; a multi-layer conductive substrate 12, including insulated material having multiple conductive traces formed therein; a BGA (Ball Grid Array) comprising an arrangement of solder balls 13, an insulative substrate 14 having a floor 15 and a set of side walls 16, with the number of side walls depending on the package configuration. A plurality of electrical connect components 17 each comprises a plurality of electrically conductive contacts 18 and an insulative buttress 19, with incapsulation material 20 for sealing a semiconductor die 11 within the semiconductor carrier. The conductive contacts 18 function as leads for the semiconductor die carrier.

Figure 4:
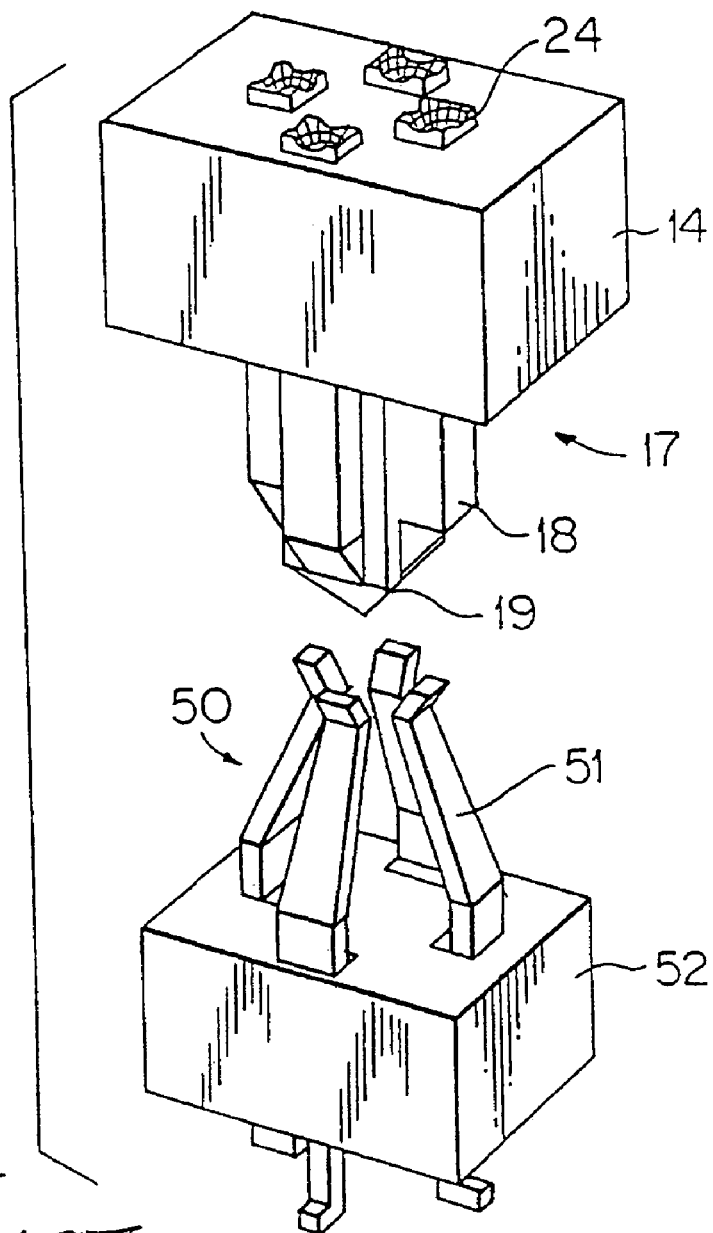
FIG. 4 is a partial perspective view illustrating plugging aspects of the semiconductor die carrier in accordance with the teachings of U.S. Pat. No. 6,577,003.

FIG. 4 illustrates the manner in which each projection-type electrical interconnect component 17 of the semiconductor die carrier may be pluggably attached to a receiving-type electrical interconnect component 50. In particular, FIG. 4 depicts the projection-type interconnect component 17 just prior to receipt within the receiving-type interconnect component 50. The plugging of each electrical interconnect component 17 on the semiconductor die carrier to a corresponding electrical interconnect component 50 results in a pluggable connection for the entire semiconductor die carrier, facilitating testing in the filed and the like.

In FIG. 4, the electrical interconnect component 17 for the semiconductor die carrier is a projection-type interconnect component, while the other electrical interconnect component 50 is a receiving-type interconnect component. However, the electrical interconnect component 17 for the semiconductor die carrier could be a receiving-type interconnect component, a hybrid-type interconnect component, or an SMT-compatible interconnect component, assuming the other electrical interconnection component 50 has a matching configuration.

The receiving-type interconnect component 50 of FIG. 4 includes a plurality of conductive contacts 51 extending from an insulative substrate 52.

In all of the prior art devices, as illustrated in FIGS. 1, 2, 3 and 4, the contacts are not substantially shielded, nor is there the high-density of electrically conductive contacts concentrated within a very small area as required by state-of-the-art microprocessors.

Figure 5:
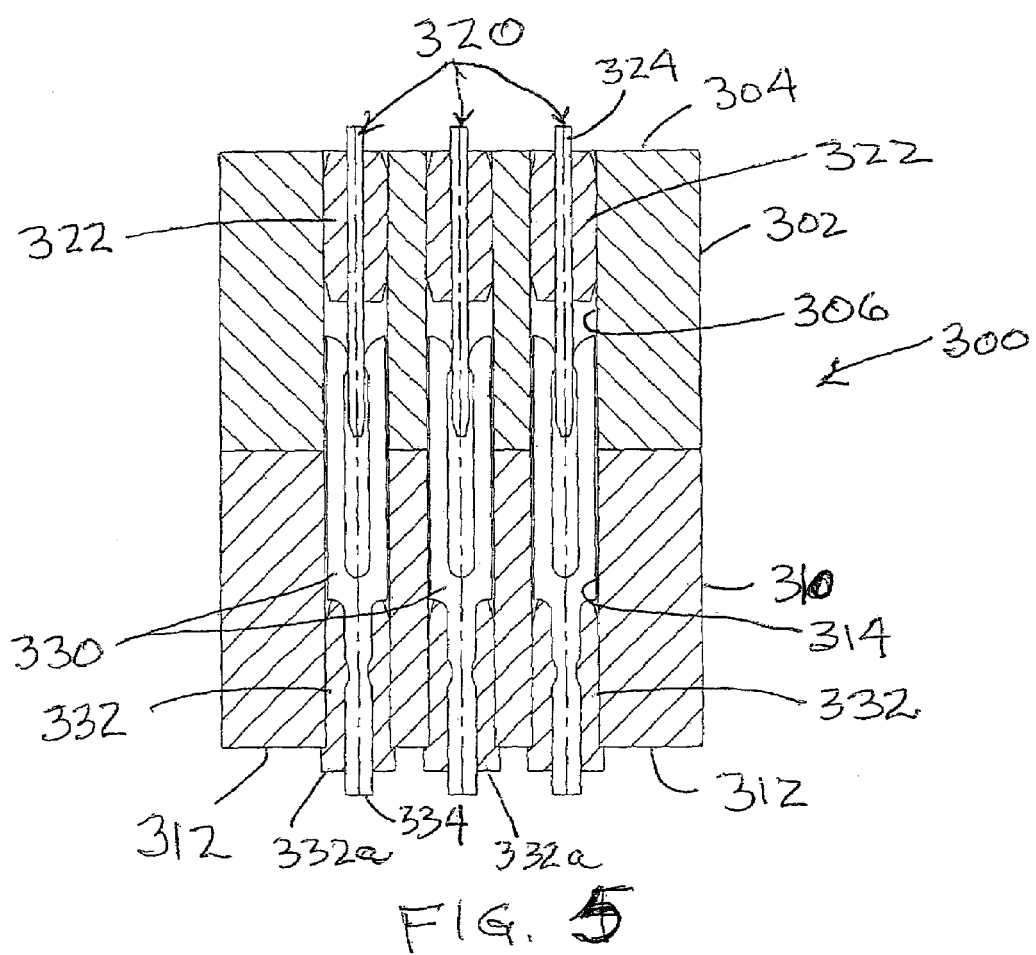
FIG. 5 is a side view, taken in cross-section, of a first embodiment of the plugging aspects of the shielded semiconductor die carrier in accordance with the present invention.

Turning to FIG. 5 which illustrates a first embodiment of the subject invention, the pluggable aspects of the shielded semiconductor chip carrier 300 basically comprises plated printed circuit boards 302 and 310; blade contacts 320; and cooperating fork-like contacts 330.

The printed circuit board 302 is plated at its upper end 304, as well as having a plated-through hole 306. Similarly, printed circuit board 310 is plated on its lower end 312, and includes a plated-through hole 314, with the plating being provided for shielding purposes. Each blade contact 320 is elongated, and is molded at its upper end with a plastic bead material 322, with the distal end 324 of the blade being exposed for connection to a semiconductor die. Each blade contact 320 is maintained in the respective plated-through hole 306 by the press fit interference connection between the molded plastic material 322 and the plated-through hole 306 in such manner that the blade contact is spaced from, and hence electrically isolated from, the plating within the plated-through hole 306.

Each fork-like contact 330 is also molded about one end thereof with a plastic bead material 332 with a portion 332a of the plastic material extending beyond the plated surface 312 of the printed circuit board. The distal end 334 of the fork-like contact 330 is exposed for connection to the leads of a printed circuit board. Each fork-like contact 330 is maintained within the plated-through hole 314 by the interference fit of the plastic material 332 and the plated-through hole 314, with the fork-like contact 330 being electrically isolated from the plating of the plated-through hole 314.

The molded plastic around the blade contacts 320 and the fork-like contacts 332 are force fit into the plated-through holes 306 and 314 of the printed circuit boards 302 and 310. As shown in FIG. 5, each blade contact 320 is electrically connected to its associated fork-like contact 330 at an intermediate position between the upper and lower printed circuit boards, with air, which is an excellent dielectric, surrounding the electrical connection between each blade contact 320 and the fork-like contact 330. At said central portion, the fork-like contacts 330 and the blade contacts 320 are spaced from the plating of the plated-through holes of the printed circuit boards, whereby substantially the entire length of the electrical interconnection between a blade contact and a fork-like contact is shielded.

The purpose of the exposed plastic portion 332a extending beyond the surface of the plated surface 312 is to facilitate soldering of the exposed distal ends 334 of the fork-like contacts 330 to the leads of a printed circuit board.

Accordingly, there is provided a new and improved shielded semiconductor chip carrier having a high-density external interface. The subject invention utilizes conventional manufacturing techniques, including well known processes for making plated-through holes and printed circuit boards. The use of an electrical interconnection of a blade with a fork-type connector provides for redundant contact, and the use of the molded plastic material about the blade and the fork-type connector ensures an interference fit between the electrical members and the plated-through holes.

Because of the interference fit between the plastic molded members and the plated-through holes, wicking of solder material during connection of the printed circuit board to the semiconductor chip carrier is prevented.

The extended molded plastic 332a effectively provides a standoff so as to facilitate soldering of a printed circuit board to the exposed distal ends 334 of the fork-like connectors 330.

The electrical contacts 320, 330 can be on various centers, at a very high density, thereby meeting the electrical characteristics required by the microprocessor industry.

Figure 6:
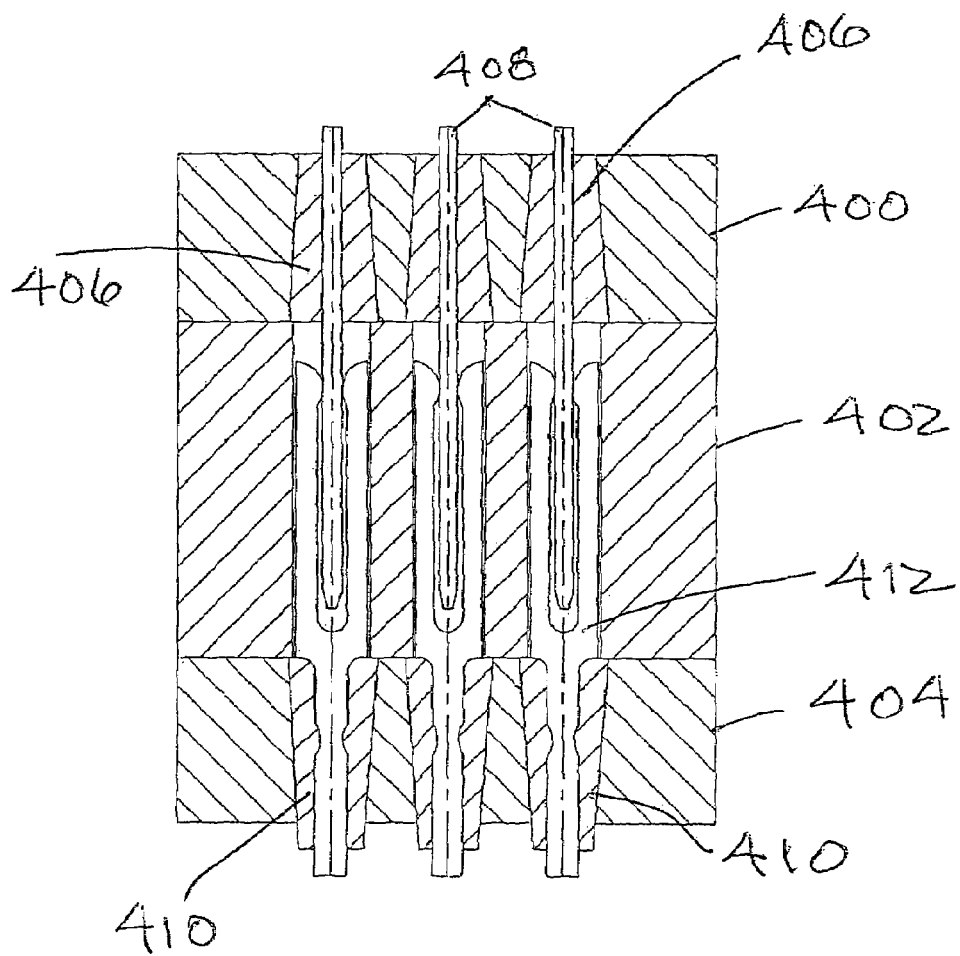
FIG. 6 is a side view, taken in cross-section, of a second embodiment of the plugging aspects of the semiconductor die carrier in accordance with the present invention.

FIG. 6 is a second embodiment of the pluggable aspects of the subject invention and is operationally similar to the embodiment of FIG. 5. As shown in FIG. 6, three printed circuit boards are employed, designated by the numerals 400, 402 and 404, each of which has a plated-through hole and with the upper and lower portions of the printed circuit boards also being plated for shielding purposes. The plastic bead 406 surrounding the blade 408 is tapered to facilitate insertion in an interference fit manner into the printed circuit board 400.

Likewise, the plastic material 410 molded to the fork-like contact 412 is tapered to facilitate the interference fit with the lower printed circuit board 404.

As in the case of the embodiment of FIG. 5, the interconnection between the blade 408 and the fork-like contact 412 occurs in the plated hole 414 extending through the central printed circuit board 402, with air (which is an excellent dielectric) surrounding the electrical interconnection.

Figure 7:
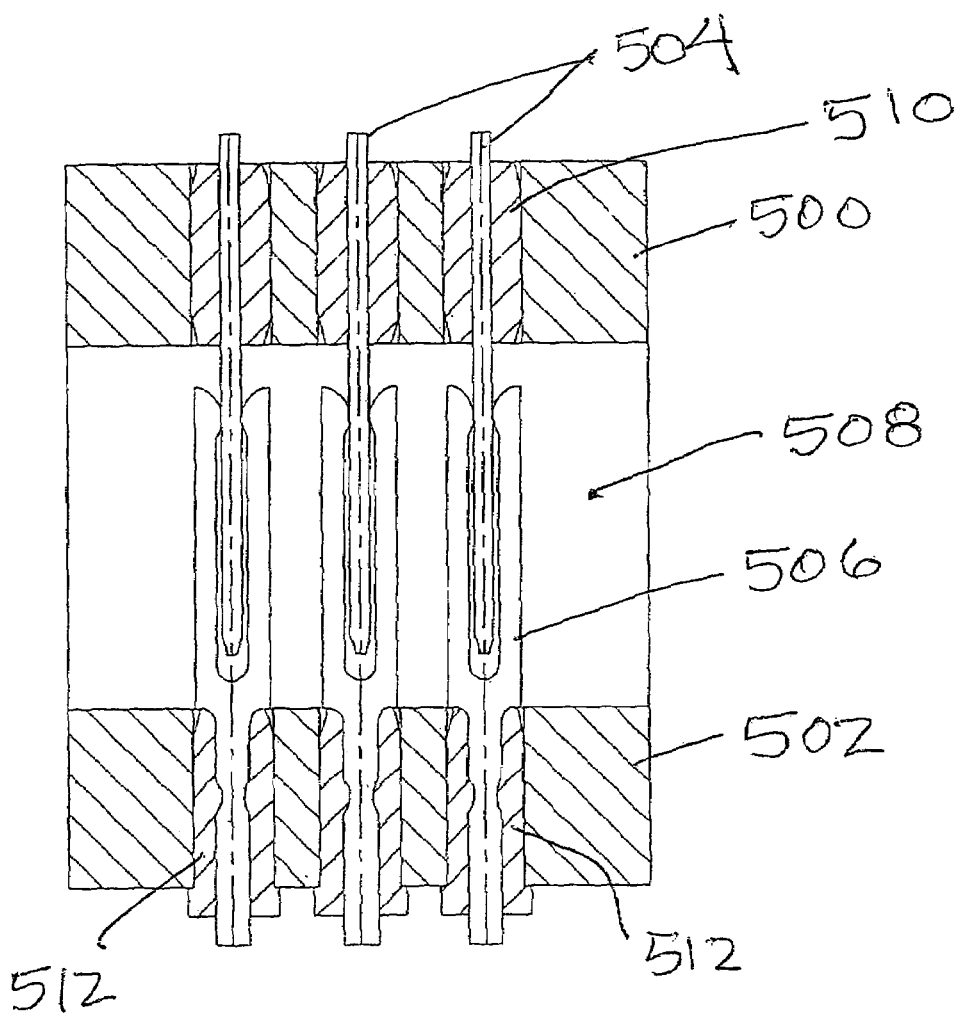
FIG. 7 is a side view, taken in cross-section, of a third embodiment of the plugging aspects of the semiconductor die carrier in accordance with the present invention.

In the embodiment of FIG. 7, the upper plated printed circuit board 500 is spaced from the lower printed circuit board 502 by suitable guide means (not shown), such that the interconnection between the blade contact 504 and the fork-like contact 506 occurs in the central region designated 508 wherein air is the dielectric surrounding the electrical contact. A plastic bead 510 is molded to the blade contact 504 and is in interference fit into the plated hole of printed circuit board 500. Similarly, plastic bead 512 is molded to the fork-like contact 506 and is in interference fit with the plated hole of printed circuit board 502.

As is readily apparent, numerous modifications and changes may readily occur to those skilled in the art and, hence, it is not desired to limit the invention to the exact constructions and embodiments shown and described. Accordingly, all suitable modification equivalents may be resorted to as falling within the scope of the invention as claimed.

What is claimed is:

1. A shielded semiconductor chip carrier, comprising:
   a housing for holding a semiconductor die;
   a semiconductor die housed within said housing;
   said housing including a conductive substrate having a plurality of parallel, plated-through holes therein; a corresponding plurality of elongated, electrically conductive first blade contacts, each first blade contact having a dielectric bead material disposed about an intermediate portion thereof, each said first blade contact being press fit into a plated-through hole so that the first blade contact is electrically isolated from said substrate, each said first blade contact having an external portion outside of said substrate and an internal portion within the interior of said substrate, said external portion being electrically connected to said semiconductor die; and
   a socket including a second conductive substrate having a plurality of parallel, plated-through holes therein, a corresponding plurality of elongated, electrically conductive second blade contacts, each said second blade contact having a dielectric bead material disposed about an intermediate portion thereof, each said second blade contact being press fit into a plated-through hole of said second conductive substrate so that each said second blade contact is electrically isolated from said second conductive substrate, each of said second blade contacts having an external portion outside of said second conductive substrate for connection to a connector component, and an internal portion within the interior of said second conductive substrate for connection to the corresponding internal portion of said first blade contact, said housing and socket being interconnected such that the semiconductor die is electrically connected to the connector component by shielded electrical connections.

2. A shielded semiconductor chip carrier as in claim 1 wherein the internal portion of each first blade contact and the internal portion of each second blade contact has a fork-like configuration.

3. A shielded semiconductor chip carrier as in claim 1 wherein the dielectric bead material is molded about each first blade contact.

4. A shielded semiconductor chip carrier as in claim 3 wherein the dielectric bead material is plastic.

5. A shielded semiconductor chip carrier as in claim 1 wherein the dielectric bead material is molded about each second blade contact.

6. A shielded semiconductor chip carrier as in claim 5 wherein the dielectric bead material is plastic.

7. A shielded semiconductor chip carrier as in claim 1 wherein a third conductive substrate is disposed between said conductive substrate and said second conductive substrate, and includes a plurality of parallel, plated-through holes therein for receiving the interconnected first blade contacts and the second blade contacts, with the interconnection of said first and second blade contacts being surrounded by air in the region of the third conductive substrate.

8. A shielded semiconductor chip carrier as in claim 1 wherein the conductive substrate and the second conductive substrate are separated by an air space.

9. A shielded semiconductor chip carrier as in claim 1 wherein the external portion of each second blade contact and the dielectric bead material surrounding said second blade contact extend beyond the surface of the second conductive substrate, with the external portion of the second blade contact extending beyond said dielectric bead material to provide a standoff to facilitate soldering of the connector component to the second blade contacts.

10. A shielded semiconductor chip carrier as in claim 1 wherein the external portion of each first blade contact extends beyond the surface of the conductive substrate.

* * * * *